United States Patent
Liu et al.

(10) Patent No.: US 10,324,571 B2
(45) Date of Patent: Jun. 18, 2019

(54) ARRAY SUBSTRATE, MANUFACTURING METHOD THEREOF AND TOUCH DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chong Liu, Beijing (CN); Haisheng Zhao, Beijing (CN); Wei Wang, Beijing (CN); Xiongtian Huang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/552,576

(22) PCT Filed: Feb. 15, 2017

(86) PCT No.: PCT/CN2017/073546
§ 371 (c)(1),
(2) Date: Aug. 22, 2017

(87) PCT Pub. No.: WO2017/197934
PCT Pub. Date: Nov. 23, 2017

(65) Prior Publication Data
US 2018/0203541 A1  Jul. 19, 2018

(30) Foreign Application Priority Data
May 19, 2016  (CN) .......................... 2016 1 0340825

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *G06F 3/0416* (2013.01);
(Continued)

(58) Field of Classification Search
CPC ... G06F 3/044; G06F 3/13338; G06F 1/13338
See application file for complete search history.

(56) References Cited

U.S. PATENT DOCUMENTS 9,638,949 B1 * 5/2017 Kim .................... G02F 1/13338
2014/0168157 A1  6/2014 Yang
(Continued)

FOREIGN PATENT DOCUMENTS

| CN | 104022127 A | 9/2014 |
| CN | 104571768 A | 4/2015 |

(Continued)

OTHER PUBLICATIONS

First Office Action for Chinese Patent Application No. 201610340825.7 dated Apr. 4, 2018.
(Continued)

*Primary Examiner* — Kent W Chang
*Assistant Examiner* — Nathaniel P Brittingham
(74) *Attorney, Agent, or Firm* — Calfee, Halter & Griswold LLP

(57) ABSTRACT

An array substrate, a manufacturing method thereof, and a touch display device are provided in the embodiments of the present invention. The array substrate includes: a common electrode layer including a plurality of self-capacitance electrodes distributed in an array; a drive circuit; and a plurality of pixel units distributed in an array. N self-
(Continued)

capacitance electrodes located in a same column constitute an electrode column, each electrode column corresponding to M columns of pixel units. The N self-capacitance electrodes located in the same column are connected with the drive circuit via N touch leads arranged within different columns of pixel units. Among the M columns of pixel units, M−N columns of pixel units provided with no touch leads are provided with dummy leads connected with the drive circuit, and the drive circuit is used to input a common voltage signal into the dummy leads and the touch leads.

17 Claims, 8 Drawing Sheets

(51) Int. Cl.
| | | |
|---|---|---|
| *G09G 3/20* | (2006.01) | |
| *H01L 27/12* | (2006.01) | |
| *G02F 1/1333* | (2006.01) | |
| *G02F 1/1362* | (2006.01) | |
| *G09G 3/36* | (2006.01) | |

(52) U.S. Cl.
CPC ....... *G09G 3/2074* (2013.01); *H01L 27/1259* (2013.01); *G02F 1/13338* (2013.01); *G02F 1/136286* (2013.01); *G06F 2203/04103* (2013.01); *G09G 3/3648* (2013.01); *G09G 2300/0413* (2013.01); *G09G 2300/0443* (2013.01); *G09G 2320/0233* (2013.01); *H01L 27/1244* (2013.01)

(56) References Cited

U.S. PATENT DOCUMENTS

| | | | |
|---|---|---|---|
| 2016/0253024 A1* | 9/2016 | Aoyama | G06F 3/0416 |
| | | | 345/174 |
| 2016/0291749 A1 | 10/2016 | Zhou et al. | |
| 2016/0294386 A1 | 10/2016 | Yang et al. | |
| 2016/0370944 A1* | 12/2016 | Zhao | G06F 3/041 |
| 2017/0060317 A1* | 3/2017 | Kim | G06F 3/0416 |
| 2017/0090635 A1* | 3/2017 | Kim | G06F 3/0412 |
| 2017/0192580 A1* | 7/2017 | Jung | G06F 3/0416 |
| 2017/0228074 A1 | 8/2017 | Du et al. | |
| 2017/0352647 A1* | 12/2017 | Raymond | H01L 25/0753 |
| 2018/0203541 A1* | 7/2018 | Liu | H01L 27/1259 |

FOREIGN PATENT DOCUMENTS

| | | |
|---|---|---|
| CN | 104615322 A | 5/2015 |
| CN | 104679321 A | 6/2015 |
| CN | 104699351 A | 6/2015 |
| CN | 105068649 A | 11/2015 |
| CN | 105549792 A | 5/2016 |
| CN | 105808014 A | 7/2016 |
| JP | 2014119795 A | 6/2014 |

OTHER PUBLICATIONS

Search Report for International Application No. PCT/CN2017/073546 dated May 19, 2017.

* cited by examiner

| | Date | 1~120 | 121~240 | 241~360 | ... | 1801~1920 | 1921~2040 | 2041~2160 |
|---|---|---|---|---|---|---|---|---|
| | | 40×3 (RGB) | 40×3 (RGB) | 40×3 (RGB) | ... | 40×3 (RGB) | 40×3 (RGB) | 40×3 (RGB) |
| Gate | | 1 | 2 | 3 | ... | 16 | 17 | 18 |
| 1~40 | 1 | | | | | | | |
| 41~80 | 2 | | | | | | | |
| 81~120 | 3 | | | | | | | |
| 121~160 | 4 | | | | | | | |
| 161~200 | 5 | | | | | | | |
| 201~240 | 5 | | | | | | | |
| ... | ... | | | | | | | |
| 1041~1080 | 27 | | | | | | | |
| 1081~1120 | 28 | | | | | | | |
| 1121~1160 | 29 | | | | | | | |
| 1161~1200 | 30 | | | | | | | |
| 1201~1240 | 31 | | | | | | | |
| 1241~1280 | 32 | | | | | | | |

Touch

ARRAY SUBSTRATE, MANUFACTURING METHOD THEREOF AND TOUCH DISPLAY DEVICE

RELATED APPLICATIONS

The present application is the U.S. national phase entry of PCT/CN2017/073546, with an international filing date of Feb. 15, 2017, which claims the benefit of Chinese Patent Application No. 201610340825.7, filed on May 19, 2016, the entire disclosures of which are incorporated herein by reference.

TECHNICAL FIELD

The present invention relates to the field of display technologies, and in particular to an array substrate, a manufacturing method thereof, and a touch display device.

BACKGROUND

With rapid development of display technologies, touch screen panels have gradually pervaded people's lives. At present, the touch screen panels can be divided into: on cell touch panels and in cell touch panels, in accordance with their composition structures. More and more in cell touch panels have been applied in high-performance display products due to their characteristics such as high transmittance and thin thickness.

SUMMARY

It is thus desirable to provide an array substrate, a manufacturing method thereof, and a touch display device for alleviating or avoiding a display grayscale difference occurred between pixel units provided with touch leads and those provided with no touch leads under the control of a same data voltage.

According to an aspect of the embodiments of the present invention, an array substrate is provided, comprising: a common electrode layer comprising a plurality of self-capacitance electrodes distributed in an array; a drive circuit; and a plurality of pixel units distributed in an array. N self-capacitance electrodes located in a same column constitute an electrode column, each electrode column corresponding to M columns of pixel units, and the N self-capacitance electrodes located in the same column are connected with the drive circuit via N touch leads arranged within different columns of pixel units, wherein M and N are positive integers and M>N>>1. Among the M columns of pixel units, M-N columns of pixel units provided with no touch leads are provided with dummy leads connected with the drive circuit. Moreover, the drive circuit is used to input a common voltage signal into the dummy leads and the touch leads.

According to a further embodiment, a touch lead comprises a first sub-lead and a second sub-lead which are located in different layers and arranged to overlap each other, the first sub-lead being connected with the second sub-lead through a via.

According to a further embodiment, the array substrate further comprises data lines, and the second sub-leads are arranged in a same layer and made of a same material as the data lines of the array substrate.

According to a further embodiment, the dummy leads are arranged in a same layer as the first sub-leads.

According to a further embodiment, a number of pixel units between any two adjacent dummy leads is a fixed constant.

According to a further embodiment, each touch lead passes through all pixel units located in a same column, and/or each dummy lead passes through all pixel units located in a same column.

According to a further embodiment, a pixel unit comprises a blue sub-pixel, a red sub-pixel, and a green sub-pixel, a touch lead and/or a dummy lead being arranged within the blue sub-pixel.

According to a further embodiment, the pixel units comprise sub-pixels in which pixel electrodes are arranged, the common electrode layer being located above the pixel electrodes, and the first sub-leads being located above the second sub-leads, the self-capacitance electrodes being connected with the first sub-leads through vias.

According to a further embodiment, the pixel electrodes are in a block shape, and the self-capacitance electrodes have a strip-shaped slit pattern at positions corresponding to the pixel electrodes.

According to another aspect of the embodiments of the present invention, a touch display device is provided, which can comprise any of the array substrates as mentioned above.

According to yet another aspect of the embodiments of the present invention, a method for manufacturing any of the array substrates as mentioned above is provided, comprising: manufacturing a drive circuit. The method further comprises: forming gate lines on a base substrate; forming data lines and second sub-leads on the base substrate on which the gate lines have been formed; forming a first insulating layer on the base substrate on which the data lines and the second sub-leads have been formed; forming vias at positions of the first insulating layer corresponding to the second sub-leads; forming dummy leads on the base substrate on which the first insulating layer has been formed, and forming first sub-leads at the positions corresponding to the second sub-leads, the first sub-leads being connected with the second sub-leads through the vias to form touch leads, and the dummy leads and the touch leads being both connected with the drive circuit; and forming, on the base substrate on which the dummy leads and the touch leads have been formed, a plurality of self-capacitance electrodes distributed in an array.

According to a further embodiment, the method further comprises: prior to forming the plurality of self-capacitance electrodes distributed in an array, forming a second insulating layer on the base substrate on which the dummy leads and the touch leads have been formed, and forming further vias at positions of the second insulating layer corresponding to the first sub-leads, the self-capacitance electrodes being connected with the touch leads through the further vias.

An array substrate, a manufacturing method thereof and a touch display device are provided in the embodiments of the present invention. The array substrate comprises: a common electrode layer comprising a plurality of self-capacitance electrodes distributed in an array; a drive circuit; and a plurality of pixel units distributed in an array. N self-capacitance electrodes located in a same column constitute an electrode column, each electrode column corresponding to M columns of pixel units, and the N self-capacitance electrodes located in the same column are connected with the drive circuit via N touch leads arranged within different columns of pixel units, wherein M and N are positive integers and M>N>>1. Among the M columns of pixel units, M-N columns of pixel units provided with no touch leads are provided with dummy leads connected with the drive circuit, and the drive circuit is used to input a common voltage signal into the dummy leads and the touch leads.

In this way, by providing dummy leads in M-N columns of pixel units provided with no touch leads, the driving circuit can input a same common voltage signal to the dummy leads as to the touch leads, such that the parasitic capacitance generated between the dummy leads and the gate lines is the same as that generated between the touch leads and the gate lines. In this case, both pixel units provided with touch leads and those provided with no touch leads can be affected by the same parasitic capacitance. As a result, under the control of a same data voltage, the display grayscale difference between the pixel units can be reduced, thus improving the display effect.

BRIEF DESCRIPTION OF DRAWINGS

In order to illustrate the embodiments of the present invention more clearly, the drawings required to be used in description of the embodiments or the prior art are briefly introduced below. It is apparent from the description that the drawings in the following descriptions are only used to illustrate some embodiments of the present invention. For those having ordinary skills in the art, other drawings can be further obtained from these drawings without undue experimentation.

REFERENCE SIGNS

01—base substrate; 10—self-capacitance electrode; 100—electrode column; 11—touch lead; 111—first sub-lead; 112—second sub-lead; 12—dummy lead; 13—pixel electrode; 14—via; 15—first insulating layer; 16—second insulating layer; 20—drive circuit; 30—pixel unit; 301—sub-pixel; G—gate of TFT; S—source of TFT; D—drain of TFT.

DETAILED DESCRIPTION OF EMBODIMENTS

The technical solutions in the embodiments of the present invention are described clearly and completely below in combination with the drawings in the embodiments of the present invention. it is apparent from the description that the embodiments described are only a part of the embodiments of the present invention, not all of them. All other embodiments obtained by a person having ordinary skills in the art without undue experiments shall fall within the protection scope of the present invention based on the embodiments in the present invention.

Figure 1:
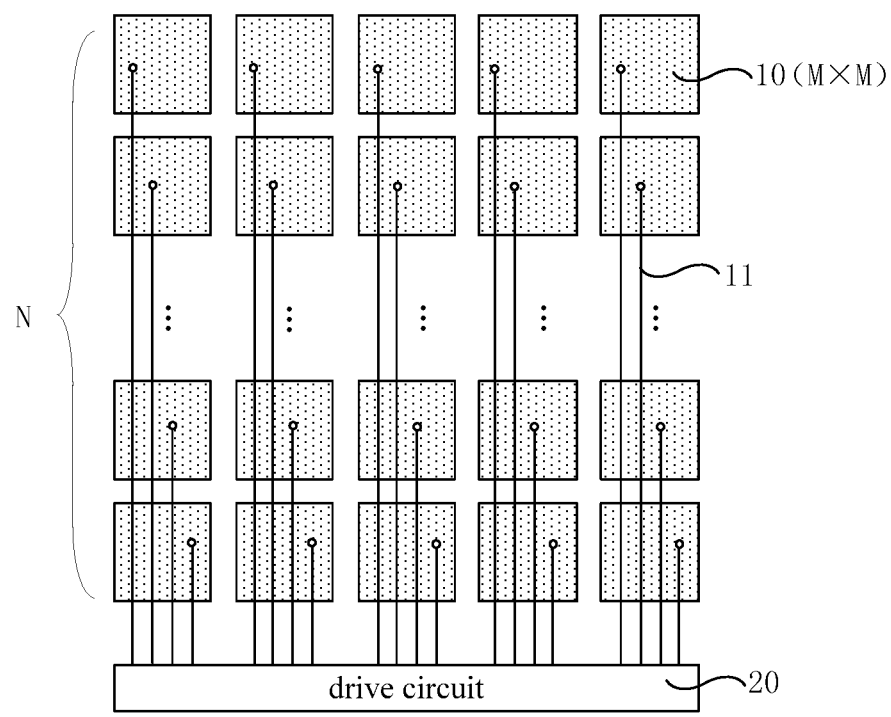
FIG. 1 is a schematic structure diagram of an array substrate provided in the prior art.

The existing in cell touch panels mainly have two types of structures: mutual-capacitance and self-capacitance. As shown in FIG. 1, a current self-capacitance touch panel can include a plurality of block-shaped self-capacitance electrodes 10. Each self-capacitance electrode 10 is connected with a drive circuit 20 via a touch lead 11. When a user touches the touch panel, the capacitance of a self-capacitance electrode 10 at a touch position of fingers will be changed such that the touch position of fingers can be determined from vertical and horizontal coordinates of the self-capacitance electrode 10 where the change took place.

Generally, the self-capacitance electrodes 10 are square. Each self-capacitance electrode 10 corresponds to a position of M×M pixel units. A number of self-capacitance electrodes 10 located in a same column is N, wherein N is different from M. For example, when M=40 and N=32, self-capacitance electrodes 10 located in a same column can be connected with the drive circuit 20 via 32 mutually insulated touch leads 11, respectively. In order to avoid touch blind regions, the touch leads 11 are generally arranged within the pixel units and the 32 mutually insulated touch leads 11 can be located within pixel units of different columns. However, since M=40, N=32, and M is greater than N, there are pixel units provided with no touch leads 11 among M columns of pixel units corresponding to the position of the self-capacitance electrodes 10 of a same column. In this case, since parasitic capacitance can be generated between the touch leads 11 and the gate lines and the parasitic capacitance will influence the display grayscale of the pixel units, there may be a display grayscale difference between pixel units provided with touch leads 11 and those provided with no touch leads 11 under the control of a same data voltage, which for example results in square display defects and thus reduces display uniformity.

Figure 2:
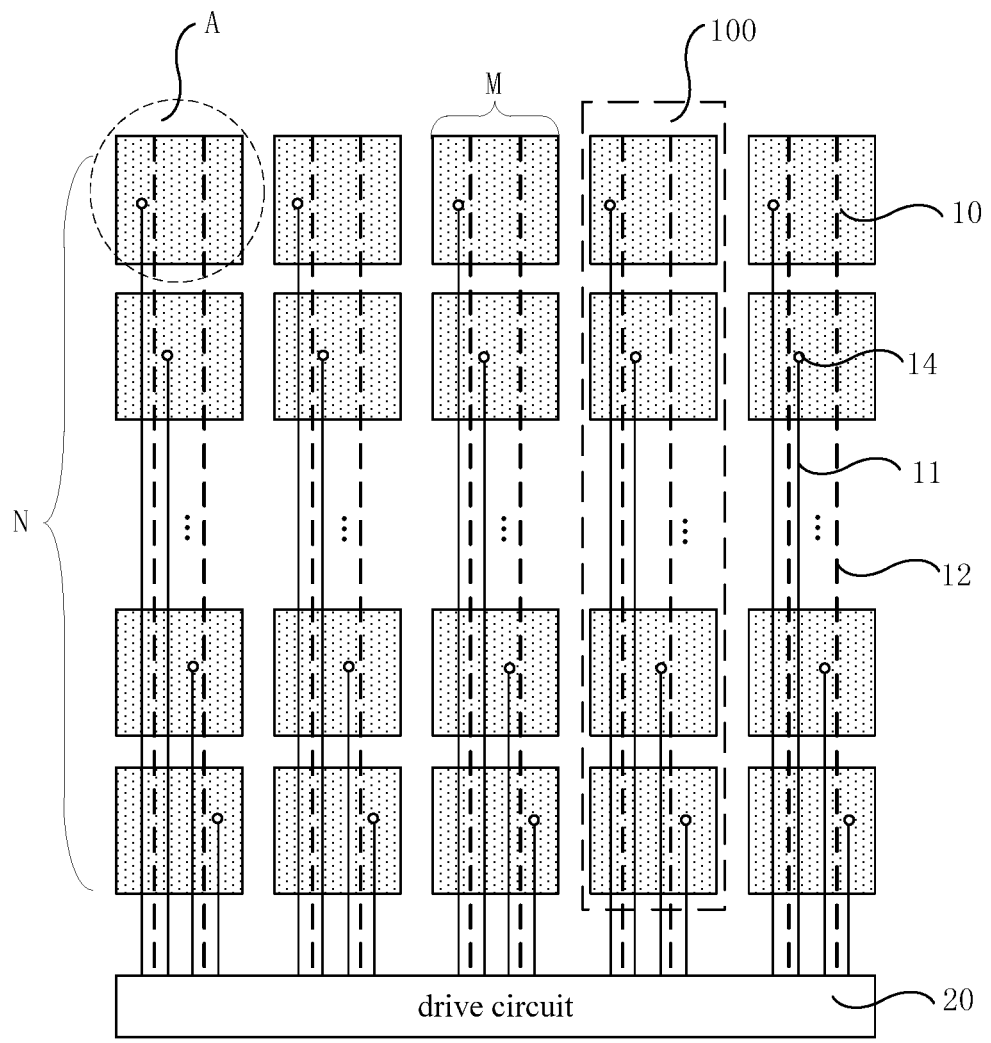
FIG. 2 is a schematic structure diagram of an array substrate provided in an embodiment of the present invention.
Figure 3:
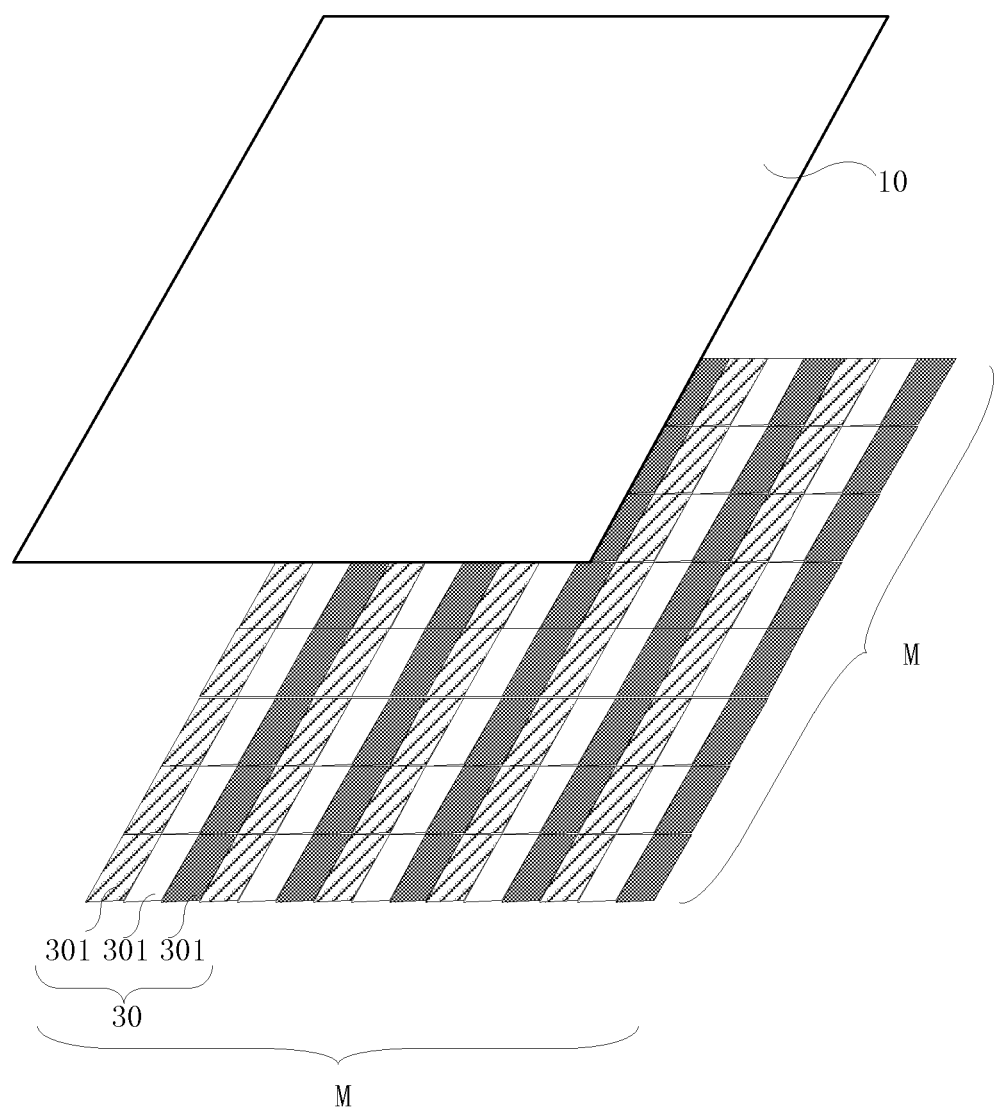
FIG. 3 is an enlarged view of region A of FIG. 2.

An array substrate is provided in an embodiment of the present invention. As shown in FIG. 2, the array substrate comprises a common electrode layer and a drive circuit 20. The common electrode layer comprises a plurality of self-capacitance electrodes 10 distributed in an array. Furthermore, as shown in FIG. 3 (an enlarged view of region A of FIG. 2), the array substrate further comprises a plurality of pixel units 30 distributed in an array.

It is noted that in a display phase, the self-capacitance electrodes 10 can be used as common electrodes to implement display. However, in a touch phase, the self-capacitance electrodes 10 can be instead reused as touch electrodes to implement touch control. A position where each self-capacitance electrode 10 is located can be referred as a touch block "Touch". The touch block "Touch" is usually square, and thus the self-capacitance electrode 10 is also generally square.

If the self-capacitance electrode 10 is square, a self-capacitance electrode 10 for example corresponds to a position of M×M pixel units 30. Each pixel unit 30 can comprise at least three sub-pixels 301 having different colors, for example, red (R), green (G) and blue (B) sub-pixels 301. Or, each pixel unit 30 can comprise a red sub-pixel, a blue sub-pixel, a green sub-pixel and a white sub-pixel. A region where each sub-pixel 301 is located can be defined by a gate line "Gate" and a data line "Data" which are crisscrossing.

In this case, as shown in FIG. 2, an electrode column 100 is comprised of N self-capacitance electrodes 10 located in a same column, each electrode column 100 corresponding to M columns of pixel units 30, and the N self-capacitance electrodes 10 located in the same column are connected with the drive circuit 20 via N touch leads 11 arranged within different columns of pixel units 30. M and N are positive integers and M>N>>1. Moreover, M-N columns of pixel units 30 from M columns of pixel units 30 that are provided with no touch leads 11 are provided with dummy leads 12. The dummy leads 12 are connected with the drive circuit 20, and the drive circuit 20 is used to input a common voltage signal (Vcom) into the dummy leads 12 and the touch leads 11.

Figure 4:
FIG. 4 is a schematic diagram of a layout of touch blocks provided in an embodiment of the present invention.

For example, for a display device with a resolution of 1280×720, a layout of the touch blocks "Touch" is shown in FIG. 4. 18 touch blocks "Touch" is comprised in each row, and 32 touch blocks "Touch" are comprised in each column, and each touch block "Touch" corresponds to 40×40 pixel units 30. Since a touch block "Touch" corresponds to a self-capacitance electrode 10, 32 self-capacitance electrodes 10 is comprised in an electrode column 100 in FIG. 2, and the electrode column 100 corresponds to 40 columns of pixel units 30. Therefore, the 32 self-capacitance electrodes 10 in the electrode column 100 can be connected with the drive electrode 20 via 32 touch leads 11 arranged within different columns of pixel units 30.

Figure 5:
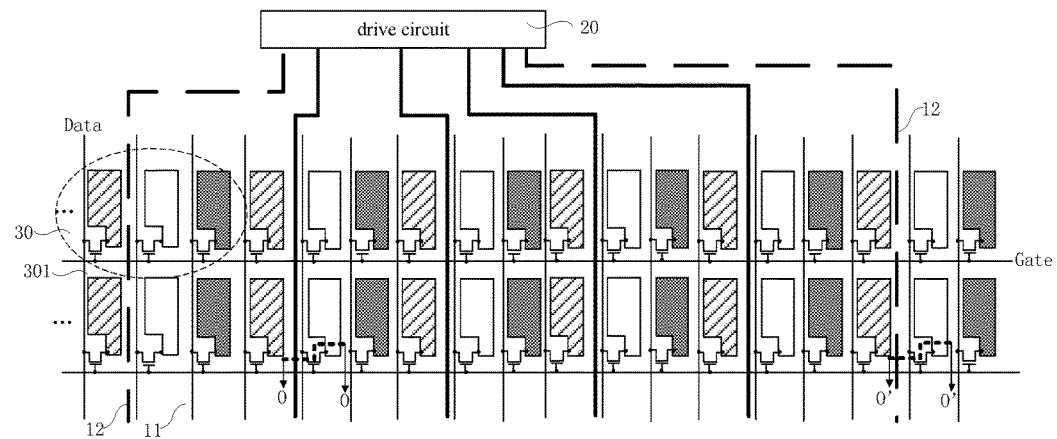
FIG. 5 is a schematic diagram of arrangement of dummy leads in FIG. 2.

In this case, among the 40 columns of pixel units 30 corresponding to the position of the electrode column 100, there are 8 columns (40−32=8) of pixel units 30 provided with no touch leads 11. Therefore, pixel units 30 provided with the touch leads 11 can be provided with dummy leads 12. In order to have the dummy leads 12 distributed on the array substrate uniformly, a number of the pixel units 30 between any two adjacent dummy leads 12 can be a fixed constant. For example, for a solution in which the position of the electrode column 100 corresponds to 40 columns of pixel units 30, 4 pixel units 30 can be spaced between two adjacent dummy leads 12, as shown in FIG. 5.

To sum up, by providing dummy leads in M-N columns of pixel units provided with no touch leads, the drive circuit can input a same common voltage signal to the dummy leads as to the touch leads, such that parasitic capacitances generated between the dummy leads and the gate lines are the same as those generated between the touch leads and the gate lines. In this case, both of pixel units provided with touch leads and those provided with no touch leads can be affected by the same parasitic capacitances. As a result, under the control of a same data voltage, a display grayscale difference between the pixel units can be reduced, thus improving the display effect.

Furthermore, by arranging the touch leads 11 within the pixel units 30, touch blind regions caused by arrangement of the touch leads 11 between two adjacent touch blocks can be avoided. Also, since there may be not enough wiring space reserved between two adjacent touch blocks, dummy leads 12 are be arranged within the pixel units 30 even if they are not required to be connected with the self-capacitance electrodes 10.

if a pixel unit 30 comprises blue (B), red (R) and green (G) sub-pixels 301, since human eyes are less sensitive to blue, according to a further embodiment, the touch leads 11 and/or the dummy leads 12 can be arranged within the blue (B) sub-pixels 301. In this way, the influence on the display effect by the arrangement of the touch leads 11 and/or the dummy leads 12 within the pixel units 30 can be reduced.

Figure 6:
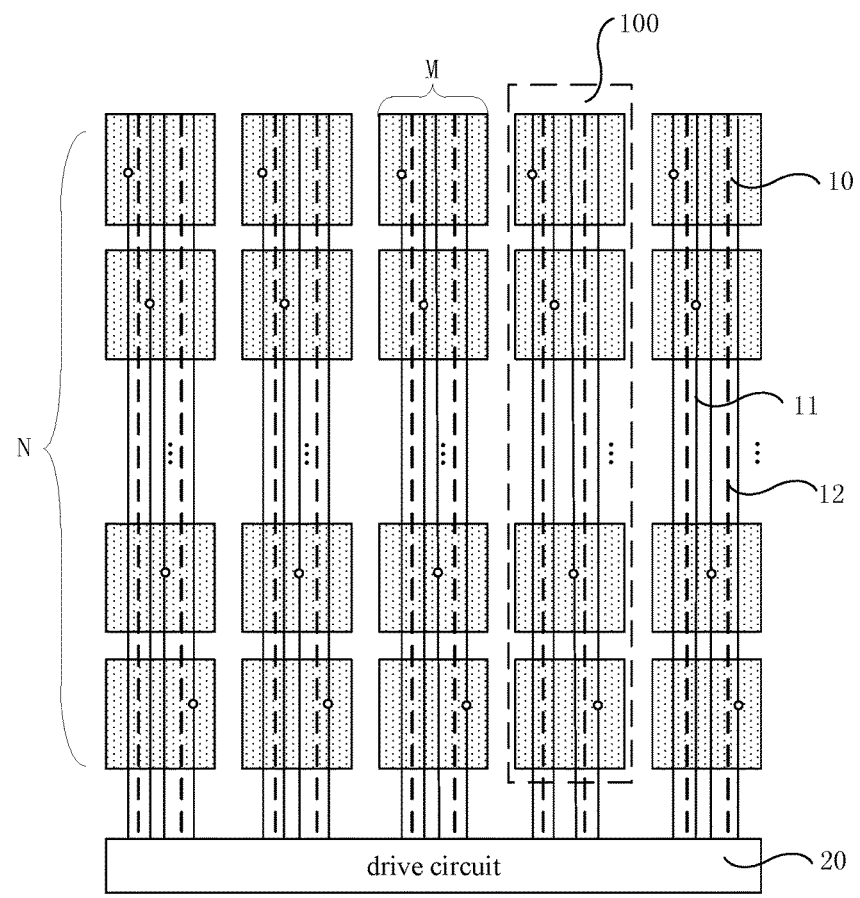
FIG. 6 is a schematic structure diagram of another array substrate provided in an embodiment of the present invention.

Furthermore, as shown in FIG. 2, the touch leads 11 can be connected with the self-capacitance electrodes 10 through vias 14. If touch leads 11 started at positions of the vias 14 are manufactured, it may result in that the touch leads 11 are densely distributed in some regions of the array substrate while sparsely in others, thus leading to display nonuniformity easily. Therefore, according to a further embodiment, as shown in FIG. 6, each touch lead 11 passes through all pixel units 30 located in a same column, and/or each dummy lead 12 passes through all pixel units 30 located in a same column. As such, the touch leads 11 and the dummy leads 12 can be distributed on the entire array substrate uniformly so as to reduce the display differences.

The specific structures of the touch leads 11 and the dummy leads 12 are illustrated in detail below by way of example.

An end of a touch lead 11 can be connected with a self-capacitance electrode 10 through a via 14, and the other end of the touch lead 11 is connected with the drive circuit 20. Therefore, the common voltage signal (Vcom) outputted by the drive circuit 20 can be outputted to the self-capacitance electrode 10 via the touch lead 11, and the self-capacitance electrode 10 can be thus charged such that it can act as an electrode of a liquid crystal capacitor during the display phase. Furthermore, the self-capacitance electrode 10 can act as an electrode of a self-capacitor during the touch phase. Therefore, if the touch lead 11 has a large resistance, in order to ensure that the voltage signal received by the self-capacitance electrode 10 remains unchanged, it is necessary to increase a load of the drive circuit 20 accordingly, which will increase power consumption of driving.

Figure 7:
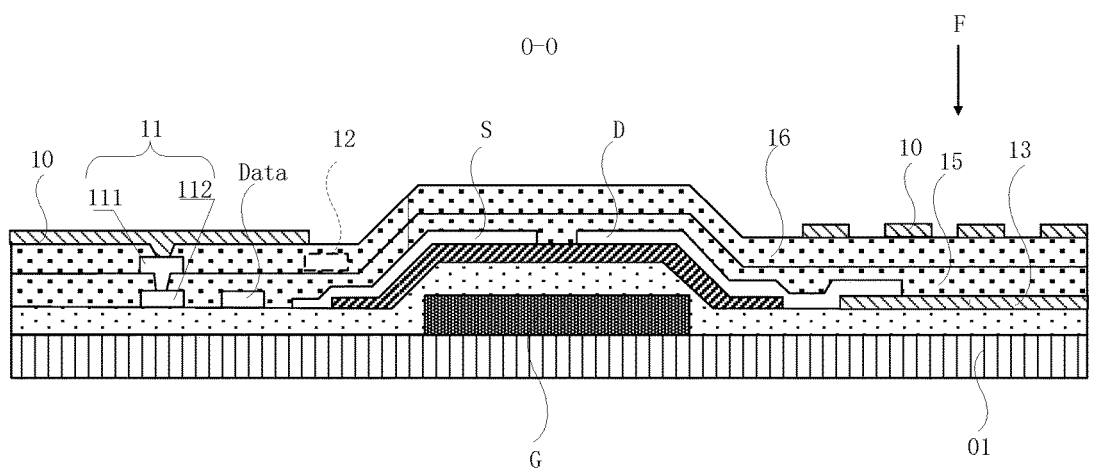
FIG. 7 is a sectional diagram of FIG. 5 obtained along line O-O.

As a result, in order to decrease the power consumption of the drive circuit 20, as shown in FIG. 7 (a sectional view of FIG. 5 obtained along line O-O), the touch leads 11 can comprise two layers of metal wires. Specifically, the touch lead 11 can comprise a first sub-lead 111 and a second sub-lead 112 which are located in different layers and arranged to overlap each other. The first sub-lead 111 is connected with the second sub-lead 112 through a via. The first sub-lead 111 can be connected with the self-capacitance electrode 10 through the via 14. In this way, the first sub-lead 111 can be in parallel with the second sub-lead 112, which can reduce the resistance of the touch lead 11, thereby decreasing the power consumption of the drive circuit 20.

Furthermore, in order to simplify the manufacturing process, the second sub-lead 112 can be arranged in a same layer and made of a same material as the data line "Data" on the array substrate. In this way, the second sub-lead 112 can be manufactured during manufacture of the data line "Data". In this case, the material for forming the second sub-lead 112 can be referred as Source Data Touch (SDT). The first sub-lead 111 can be formed of a same material as the data line "Data", or of other conductive metal materials. Therefore, the material for forming the first sub-lead 111 can be referred as Touch Panel Metal (TPM).

For a lead comprising a first sub-lead and a second sub-lead, if the second sub-lead is arranged in a same layer as the data line "Data", there may result in a short circuit between the second sub-lead and a data line "Data" adjacent thereto during manufacture of the second sub-lead. The voltage of the shorted data line "Data" will be pulled low to a common voltage of the second sub-lead such that during the display, a data voltage cannot be inputted into the sub-pixels 301 provided with the shorted data line "Data" via the data line "Data". As a result, the sub-pixels 301 cannot be displayed normally, which leads to square display defects.

Figure 8:
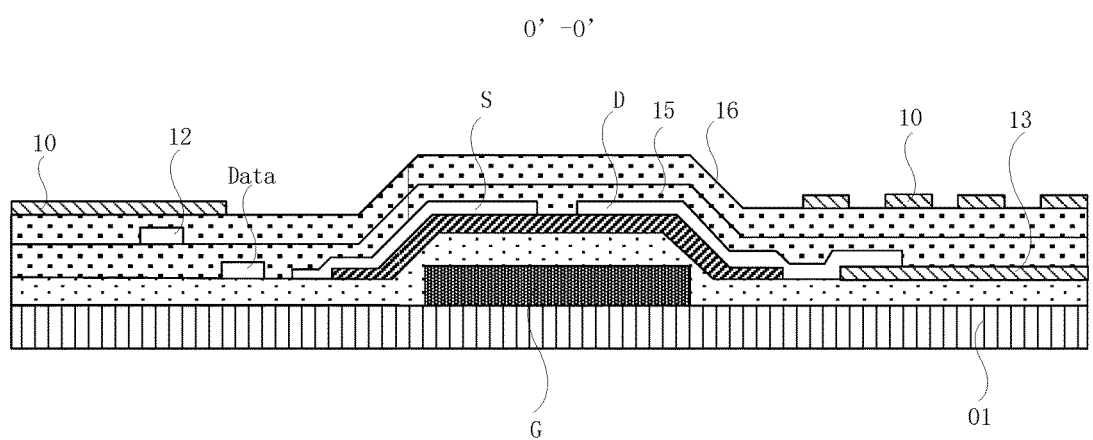
FIG. 8 is a sectional diagram of FIG. 5 obtained along line O'-O'.

In order to reduce the probability of the square display defects, as shown in FIG. 8 (a sectional view of FIG. 5 obtained along line O'-O'), a dummy lead 12 can be formed of only a single layer of metal wires. To simply the manufacture process, the dummy lead 12 can be arranged in a same layer as a first sub-lead 111.

In this way, since the dummy lead 12 do not comprise a second sub-lead, i.e., it is unnecessary to provide a second sub-lead in a same layer as the data line "Data", it can be ensured that data lines "Data" in the sub-pixels 301 provided with the dummy leads 12 will not be shorted, which can reduced about 20% of the square display defects. Moreover, since the dummy lead 12 does not need to be connected with the self-capacitance electrode 10 and it is only used to receive the common voltage signal (Vcom) outputted by the drive circuit 20 without serving as a signal transmission path that the drive circuit 20 is used to actuate loads, the power consumption of the drive circuit 20 will not be increased even if a single layer of metal wires is used.

Furthermore, during the touch process, finger pressing is required for changing the self-capacitance formed between a self-capacitance electrode 10 and a grounding end GND and a touch position is determined according to the coordinates of the self-capacitance electrode 10 where the change took place, so in order to improve a touch sensitivity, the self-capacitance electrode 10 should be arranged on a side close to the fingers to the greatest extent. Therefore, as shown in FIG. 5, if the pixel unit 30 comprises sub-pixels 301 and as shown in FIG. 7 or FIG. 8, pixel electrodes 13 are provided in the sub-pixels 301, the common electrode layer comprising a plurality of self-capacitance electrodes 10 is located above the pixel electrodes 13. That is, relative to the pixel electrodes 13, the self-capacitance electrodes 10 are far away from the base substrate 01.

In this case, the first sub-leads 111 are located above the second sub-leads 112. The self-capacitance electrodes 10 are connected with the first sub-leads 111 through vias so as to implement connection of the touch leads 11 with the self-capacitance electrodes 10.

Figure 9:
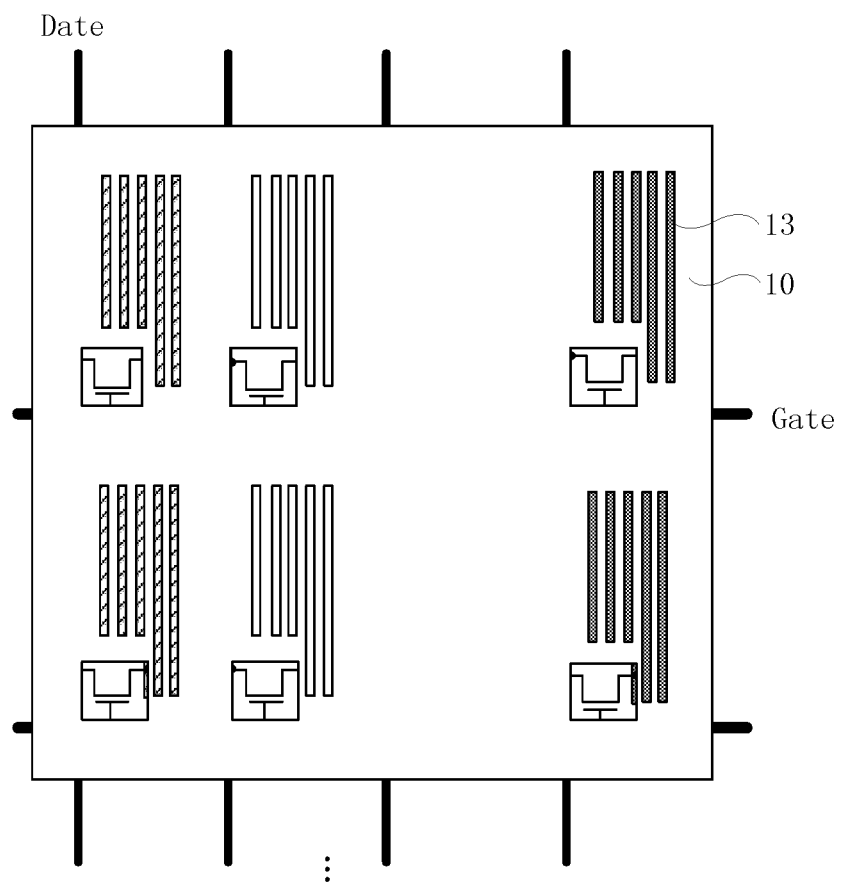
FIG. 9 is a schematic diagram of FIG. 7 obtained in direction F.

When the common electrode layer and the pixel electrodes are both arranged on the array substrate, the array substrate can be used for forming an advanced-super dimensional switching (ADS for short) display device. In this case, as shown in FIG. 9, the pixel electrodes 13 are in a block shape, and the self-capacitance electrodes 10 comprised in the common electrode layer have a strip-shaped slit pattern at positions corresponding to the pixel electrodes 13. Therefore, a multidimensional electric field can be formed from both a parallel electric field generated at edges of pixel electrodes in a same plane and a longitudinal electric field generated between the pixel electrodes and the common electrode layer, such that liquid crystal molecules with all orientations located between and right above the pixel electrodes within a liquid crystal cell can be rotated and converted, thus improving the operation efficiency of liquid crystals in a planar orientation system and the light transmission efficiency.

The embodiments of the present invention further provide a touch display device, which can comprise any array substrate mentioned above. Since the structure of the array substrate has been described in detail in the above embodiments, no more descriptions shall be given herein for simplicity.

It is noted that in the embodiments of the present invention, the display device can for example comprise a liquid crystal display device. For instance, the display device can be any product or component having a display function, such as a liquid crystal display, a liquid crystal television, a digital photo frame, a phone or a tablet computer.

Figure 10:
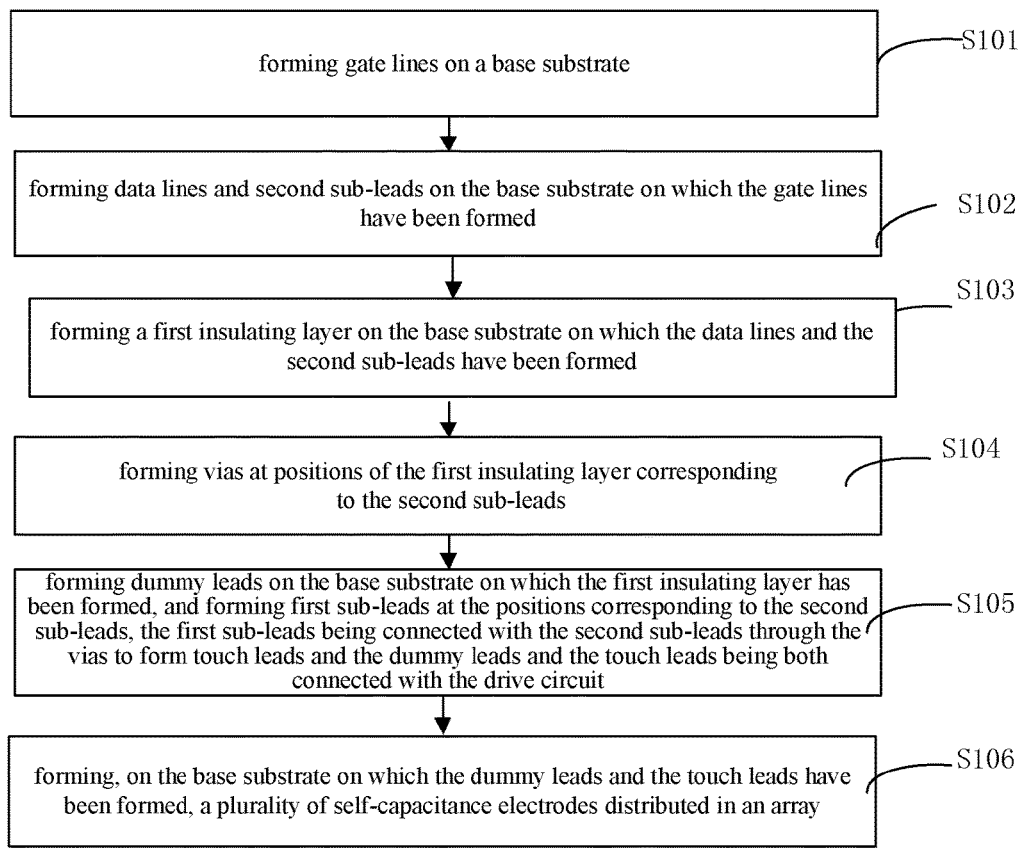
FIG. 10 is a flow chart of a method for manufacturing an array substrate provided in an embodiment of the present invention.

The embodiments of the present invention further provide a method for manufacturing any of the array substrates as mentioned above, comprising: manufacturing a drive circuit. Furthermore, as shown in FIG. 10, the method can further comprise the following steps.

S101, gate lines are formed on a base substrate. For example, a gate metal layer is formed on the base substrate 01 as shown in FIG. 7 or FIG. 8, and gate lines "Gate" are formed through a patterning process. Furthermore, a gate G of a thin film transistor (TFT) can also be formed during formation of the gate lines.

It is noted that in the embodiments of the present invention, the patterning process can comprise a photolithography process, or a photolithography process and an etch step. In addition, the patterning process can also comprise other processes for forming predetermined patterns, such as printing or ink jetting. The photolithography process can refer to a process for forming patterns by using a photoresist, a mask plate, an exposure device and so on, and comprises process procedures such as film-forming, exposing and developing. A corresponding patterning process can be selected based on the structure to be formed in the embodiments of the present invention.

S102, data lines and second sub-leads are formed on the base substrate on which the gate lines have been formed. For example, a data metal layer is formed on the base substrate 01 on which the gate lines have been formed, and the data lines "Data" and the second sub-leads 112 are formed through a patterning process.

During formation of the data lines "Data" and the second sub-leads 112, a source S and a drain D of the TFT can also be formed.

S103, a first insulating layer 15 is formed on the base substrate on which the data lines "Data" and the second sub-leads 112 have been formed.

The material for forming the first insulating layer 15 can comprise silicon nitride. Or, in order to reduce power consumption of display, the first insulating layer 15 can be formed by using a resin material with a low dielectric constant.

S104, vias are formed at positions of the first insulating layer 15 corresponding to the second sub-leads 112.

S105, dummy lines are formed on the base substrate on which the first insulating layer has been formed, and first sub-leads are formed at the positions corresponding to the second sub-leads. The first sub-leads are connected with the second sub-leads through vias to form touch leads, and the dummy leads and the touch leads are both connected with the drive circuit.

For example, a further data metal layer is formed on the base substrate on which the first insulating layer 15 has been formed. The dummy leads 12 as shown in FIG. 8 are formed through a patterning process, and as shown in FIG. 7, the first sub-leads 111 are formed at positions corresponding to the second sub-leads 112. The first sub-leads 111 are connected with the second sub-leads 112 through the vias formed in step S104, thereby forming the touch leads 11. To simplify the process, the first sub-leads 111 can be also arranged in a same layer and made of a same material as the dummy leads 12.

The formed dummy leads 12 and the touch leads 11 are both connected with the drive circuit 20 and used for receiving the common voltage signal (Vcom) outputted by the drive circuit 20.

S106, a plurality of self-capacitance electrodes 10 distributed in an array are formed on the base substrate 01 on which the dummy leads 12 and the touch leads 11 have been formed. For example, N self-capacitance electrodes 10 form an electrode column 100.

According to a further embodiment, the method further comprises: after step S105 and prior to step S106, forming a second insulating layer on the base substrate on which the dummy leads and the touch leads have been formed, and forming further vias at positions of the second insulating layer corresponding to the first sub-leads. The self-capacitance electrodes can be connected with the touch leads through the further vias.

For example, a second insulating layer 16 is formed on the base substrate 01 on which the touch leads 11 and the dummy leads 12 have been formed, and then further vias are formed at positions of the second insulating layer 16 corresponding to the first sub-leads 111 such that the self-capacitance electrodes 10 formed in step S106 can be connected with the touch leads 11 comprising the first sub-leads 111 and the second sub-leads 112 through the further vias (as shown in FIG. 7). The second insulating layer 16 can be made of a same material as the first insulating layer 15.

In contrast, the dummy lead 12 do not need to be connected with the self-capacitance electrode 10, and thus it is unnecessary to manufacture a via at a position of the second insulating layer 16 corresponding to the dummy lead 12 as shown in FIG. 8.

On one hand, by providing dummy leads in M-N columns of pixel units provided with no touch leads, the driving circuit can input a same common voltage signal to the dummy leads as to the touch leads, such that the parasitic capacitance generated between the dummy leads and the gate lines is the same as that generated between the touch leads and the gate lines. In this case, both of pixel units provided with touch leads and those provided with no touch leads can be affected by the same parasitic capacitance. As a result, under the control of a same data voltage, the display grayscale difference between the pixel units can be reduced, thus improving the display effect. On the other hand, if the touch leads comprise first sub-leads and second sub-leads connected through vias, the resistances of the touch leads can be decreased, thus reducing the power consumption of the drive circuit. If the second sub-leads in the touch leads are arranged in a same layer and made of a same material as the data lines on the array substrate, the second sub-leads can be manufactured during the manufacture of the data lines, which simplifies the manufacture process. If the dummy leads are arranged in a same layer as the first sub-leads, not only can the process be simplified, but also short circuits of the data lines in the sub-pixels provided with the dummy leads can be avoided, which can reduce the square display defects. Moreover, since the dummy leads do not need to be connected with the self-capacitance electrodes and are only used for receiving the common voltage signal outputted by the drive circuit without serving as a signal transmission path that the drive circuit is used to actuate loads, the power consumption of the drive circuit will not be increased even if a single layer of metal wires is used to form the dummy leads.

The forgoing is only specific embodiments of the present invention, but the protection scope of the present invention is not limited thereto. Any variation or substitute easily conceivable by a skilled person familiar with this art within the technical scope of the present invention shall fall within the protection scope of the present invention. Therefore, the protection scope of the present invention should be limited by the protection scope of the appended claims.

The invention claimed is:

1. An array substrate, comprising:
   a common electrode layer comprising a plurality of self-capacitance electrodes distributed in an array;
   a drive circuit; and
   a plurality of pixel units distributed in an array, wherein the pixel units comprise blue sub-pixels, red sub-pixels, and green sub-pixels,
   wherein N self-capacitance electrodes located in a same column constitute an electrode column, each electrode column corresponding to M columns of pixel units, and the N self-capacitance electrodes located in the same column are connected with the drive circuit via N touch leads arranged within different columns of pixel units, each touch lead passes through all pixel units located in a same column, M and N being positive integers and M>N>>1, the touch leads are arranged within the blue sub-pixels, and
   wherein among the M columns of pixel units, M-N columns of pixel units provided with no touch leads are provided with dummy leads, the dummy leads being connected with the drive circuit, and the drive circuit is used to input a common voltage signal into the dummy leads and the touch leads, wherein the dummy leads are arranged within the blue sub-pixels and each dummy lead passes through all pixel units located in a same column.

2. The array substrate of claim 1, wherein touch leads comprise first sub-leads and second sub-leads located in different layers and arranged to overlap each other, the first sub-leads being connected with the second sub-leads through vias.

3. The array substrate of claim 2, wherein the array substrate further comprises data lines, and the second sub-leads are arranged in a same layer and made of a same material as the data lines of the array substrate.

4. The array substrate of claim 2, wherein the dummy leads are arranged in a same layer as the first sub-leads.

5. The array substrate of claim 1, wherein a number of pixel units between any two adjacent dummy leads is a fixed constant.

6. The array substrate of claim 2, wherein the pixel units comprise sub-pixels in which pixel electrodes are arranged, and the common electrode layer is located above the pixel electrodes, and
   wherein the first sub-leads are located above the second sub-leads, and the self-capacitance electrodes are connected with the first sub-leads through vias.

7. The array substrate of claim 6, wherein the pixel electrodes are in a block shape, and the self-capacitance electrodes have a strip-shaped slit pattern at positions corresponding to the pixel electrodes.

8. A touch display device comprising the array substrate of claim 1.

9. A method for manufacturing an array substrate wherein the array substrate comprises
   a common electrode layer comprising a plurality of self-capacitance electrodes distributed in an array;
   a drive circuit; and
   a plurality of pixel units distributed in an array, wherein the pixel units comprise blue sub-pixels, red sub-pixels, and green sub-pixels,
   wherein N self-capacitance electrodes located in a same column constitute an electrode column, each electrode column corresponding to M columns of pixel units, and the N self-capacitance electrodes located in the same column are connected with the drive circuit via N touch leads arranged within different columns of pixel units, each touch lead passes through all pixel units located in a same column, M and N being positive integers and M>N>>1, the touch leads are arranged within the blue sub-pixels, and wherein among the M columns of pixel units, M-N columns of pixel units provided with no touch leads are provided with dummy leads, the dummy leads being connected with the drive circuit, and the drive circuit is used to input a common voltage signal into the dummy leads and the touch leads, wherein the dummy leads are arranged within the blue sub-pixels and each dummy lead passes through all pixel units located in a same column;

the method comprising:

manufacturing the drive circuit;

wherein the method further comprises:

forming gate lines on a base substrate;

forming data lines and second sub-leads on the base substrate on which the gate lines have been formed;

forming a first insulating layer on the base substrate on which the data lines and the second sub-leads have been formed;

forming vias at positions of the first insulating layer corresponding to the second sub-leads;

forming dummy leads on the base substrate on which the first insulating layer has been formed, and forming first sub-leads at the positions corresponding to the second sub-leads, the first sub-leads being connected with the second sub-leads through the vias to form touch leads, and the dummy leads and the touch leads being both connected with the drive circuit; and forming, on the base substrate on which the dummy leads and the touch leads have been formed, a plurality of self-capacitance electrodes distributed in an array.

10. The method of claim 9, further comprising:

prior to forming the plurality of self-capacitance electrodes distributed in an array, forming a second insulating layer on the base substrate on which the dummy leads and the touch leads have been formed, and forming further vias at positions of the second insulating layer corresponding to the first sub-leads, wherein the self-capacitance electrodes are connected with the touch leads through the further vias.

11. The array substrate of claim 3, wherein the dummy leads are arranged in a same layer as the first sub-leads.

12. A touch display device comprising the array substrate of claim 2.

13. A touch display device comprising the array substrate of claim 3.

14. A touch display device comprising the array substrate of claim 4.

15. A touch display device comprising the array substrate of claim 5.

16. A touch display device comprising the array substrate of claim 1.

17. A touch display device comprising the array substrate of claim 6.

* * * * *